United States Patent
Gardner et al.

[11] Patent Number: 5,942,787
[45] Date of Patent: *Aug. 24, 1999

[54] SMALL GATE ELECTRODE MOSFET

[75] Inventors: Mark I. Gardner, Cedar Creek; Robert Paiz, Austin; Thomas E. Spikes, Jr., Round Rock, all of Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/751,582

[22] Filed: Nov. 18, 1996

[51] Int. Cl.$^6$ ................................................ H07L 21/8232
[52] U.S. Cl. .......................... 257/408; 438/595; 438/926; 438/947
[58] Field of Search ..................................... 257/437, 408; 438/229, 230, 595, 926, 947, FOR 210

[56] References Cited

U.S. PATENT DOCUMENTS 5,665,203  9/1997  Lee et al. ................................. 438/585

*Primary Examiner*—David B. Hardy
*Attorney, Agent, or Firm*—Jenkens & Gilchrist, A Professional Corporation

[57] ABSTRACT

A method of lithographically fabricating small line width features in a device in accordance with a desired pattern, the small line width features being smaller than that capable of a lithographic process alone, is disclosed. A first layer of material is provided upon a substrate, the first layer including that in which the small line width features are to be made. A lithographically patterned layer is then provided upon the first layer in accordance with a second pattern defined in conjunction with the desired pattern. The patterned layer includes a second material selected to be compatible with the material of the first layer. A conformal layer is then deposited upon the patterned layer, the conformal layer including a third material selected to be compatible in conjunction with the first material and with the second material. Sidewall spacers are formed in the conformal layer proximate side edges of the patterned layer, the sidewall spacers having a desired line width dimension of the small features to be fabricated. The patterned layer is thereafter selectively removed. The first layer is then directionally etched with a selective etch, using the sidewall spacers to prevent the etching of the first layer in accordance with the desired pattern.

7 Claims, 2 Drawing Sheets

5,942,787

SMALL GATE ELECTRODE MOSFET

BACKGROUND OF THE INVENTION

1. Field of the Invention

This invention relates generally to field-effect transistor structures and, more particularly, to a method of fabricating small gate electrodes for high performance FET structures, and the like.

2. Discussion of the Related Art

In the fabrication of semiconductor devices, for example, metal-oxide semiconductor field effect transistor (MOSFET) devices, relative dimensions of the MOSFET devices is on the order of 0.35 to 0.4 $\mu$m for a line width. Such an achievable line width is directly related to the resolution of the lithographic apparatus used for patterning of the specific line width features, such as, using an i-line stepper. Other photolithographic techniques and apparatus are known in the art. For example, x-ray lithography may be used for making masks having 0.35 to 0.4 $\mu$m feature sizes thereon. However, as the feature sizes get smaller, the corresponding mask must have a better resolution than the desired feature size. It thus requires, for instance, several days for producing one mask for use in the making of a circuit on a semiconductor wafer.

It would be desirable to have a technique for producing a transistor having an extremely small transistor length, on the order of 0.1 to 0.05 $\mu$m, without resort to highly cost prohibitive measures.

SUMMARY OF THE INVENTION

It is an object of the present invention to provide a technique for lithographically producing small line width features sizes not achievable using the lithographic process alone.

In accordance with the present invention, a method of lithographically fabricating small line width features in a device in accordance with a desired pattern, the small line width features being smaller than that capable of a lithographic process alone, includes the following steps. A first layer of material is provided upon a substrate, the first layer including that in which the small line width features are to be made. A lithographically patterned layer is then provided upon the first layer in accordance with a second pattern defined in conjunction with the desired pattern. The patterned layer includes a second material selected to be compatible with the material of the first layer. A conformal layer is then deposited upon the patterned layer, the conformal layer including a third material selected to be compatible in conjunction with the first material and with the second material. Sidewall spacers are formed in the conformal layer proximate side edges of the patterned layer, the sidewall spacers having a desired line width dimension of the small features to be fabricated. The patterned layer is thereafter selectively removed. The first layer is then directionally etched with a selective etch, using the sidewall spacers to prevent the etching of the first layer in accordance with the desired pattern.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
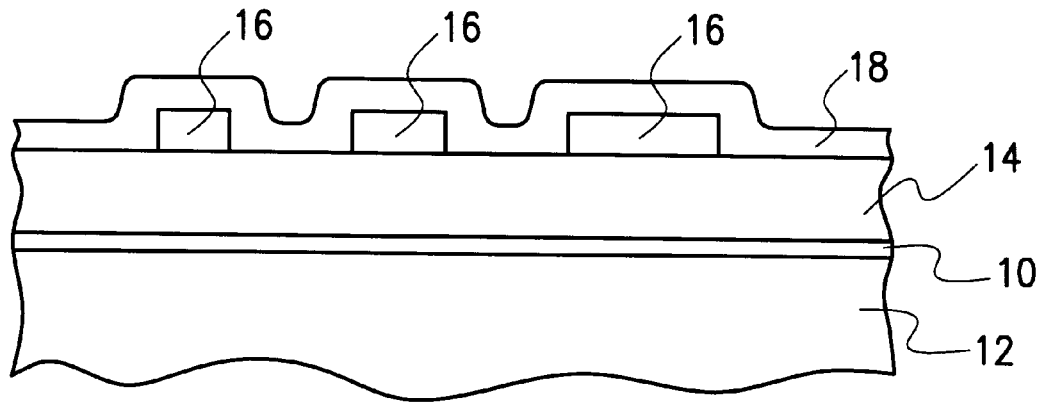
FIGS. 1–5 illustrate various steps of the method in accordance with the present invention.
Figure 2:
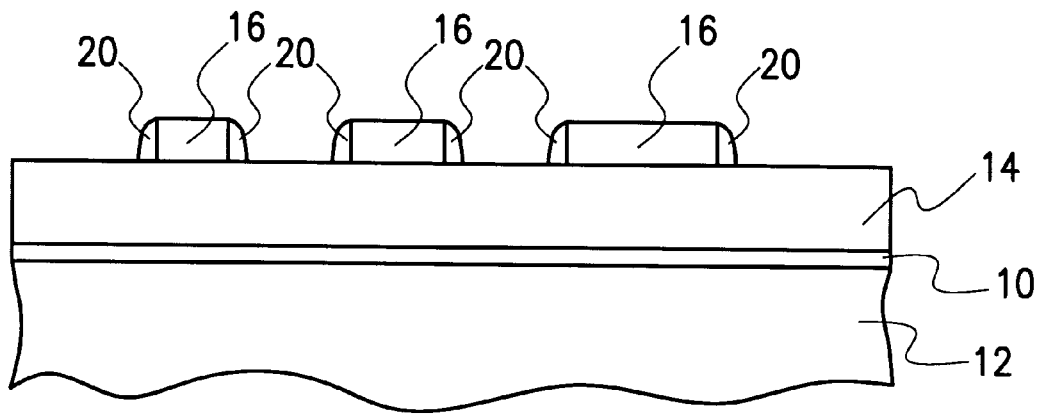

Turning now to FIGS. 1–5, in accordance with the present invention, a sacrificial film or layer is used for making small line width features. Such a small line width feature may include, for example, a small polysilicon gate electrode having a line width on the order of 0.05 to 0.1 $\mu$m. To achieve a small polysilicon line width feature, a sacrificial spacer is first produced on top of a polysilicon layer, for use as a mask from which the small features will be made. To begin, a gate oxide 10 is grown on a semiconductor substrate 12 (FIG. 1). Polysilicon 14 is then deposited onto the gate oxide layer 10 to a desired thickness. A pattern 16 is then put down on top of the wafer, that is, on top of the polysilicon 14. The pattern 16 may include a photoresist pattern, or other pattern, which may likewise include other materials, such as metal or oxide. When selecting a material for the pattern layer, the material should be compatible in connection with a subsequent layer to be deposited for the formation of spacers, as will be discussed further below. The pattern 16 is appropriately designed such that spacers may be made adjacent to the features of the pattern layer, wherein the spacers (yet to be formed) are placed in accordance with a desired pattern of the resultant small line width features.

After formation of the pattern layer 16, a material 18 for use in the formation of sacrificial spacers is deposited. Such a material may include an oxide or other material which is compatible with the pattern layer 16 of the previous step (i.e., appropriately selected). An appropriate directional etch, as known in the art, is then performed (FIG. 2) to selectively remove the conformal layer 18 of the sacrificial spacer material in all places except adjacent to the pattern layer 16. The resulting sacrificial spacers 20 are of a given desired width dimension "w". The desired width dimension w is determined in part by an initial thickness of the conformal layer 18, to be discussed further herein below.

In the instance to the patterned layer 16 including photoresist, the subsequent sacrificial spacer layer 18 can include oxide. Such an oxide is preferably deposited using a low temperature deposition, i.e., less than 200° C., corresponding to a plasma type deposition. Other materials (i.e., used for the pattern layer 16) may allow the use of different temperature depositions of the sacrificial spacer layer 18.

An advantage of the present invention is that once the sacrificial spacers 20 are formed, the remaining structure resembles that of a transistor (FIG. 2), however, it has a center region of the first material 16, i.e., the photoresist (or other material as the case may be) with sidewall spacers 20 of oxide (i.e., sacrificial spacers). As indicated above, the sacrificial spacers 20 in this instance are formed by a conformal deposition of oxide upon the patterned layer 16. The pattern layer 16 having the conformal oxide layer 18 thereon is then subjected to a directional etch, such as, a reactive ion etch (RIE). RIE etching of the conformal oxide layer 18 produces the sacrificial sidewall spacers 20 around the side edges of the patterned layer 16.

While the pattern layer 16 has been described as a photoresist layer, it may likewise include a metal pattern layer. One advantage of the pattern material is that once its intended function is completed, the patterned material is then subsequently removed. More particularly, the pattern material must be removed for the process of the present invention to work as desired. Still further, the pattern layer 16 may also include oxide, in which case, the subsequent conformal layer would preferably include nitride, such as silicon nitride ($Si_xN_y$).

Another advantage of the present invention is that spacers can be produced which have very small lateral width dimensions, on the order of 0.05 to 0.1 μm dimensions, further including sub-0.1 μm dimensions. As such, the present invention provides a remarkable technique for making small dimensions far beyond the capabilities of present day photolithographic techniques, such as, i-line lithography. The present invention produces small feature lengths, such as, small gate lengths using less costly lithographic methods without resort to highly cost prohibitive measures, such as, x-ray lithography.

The width of the sacrificial spacer 20 depends on several variables, including the initial thickness of the conformal layer 18 and the amount of subsequent directional etching. The spacer material which is chosen must be highly selective to polysilicon. Oxide is very selective to polysilicon. In addition, when forming the spacer 20, the spacer material 18 is chosen such that the polysilicon is not attacked too severely. In other words, spacer material 18 is chosen and/or selected so as to be removed selectively, without any appreciable damage to the underlying polysilicon 14. The spacer material is thus selected to minimize any interaction between the formation of the spacers and the underlying polysilicon.

Figure 3:
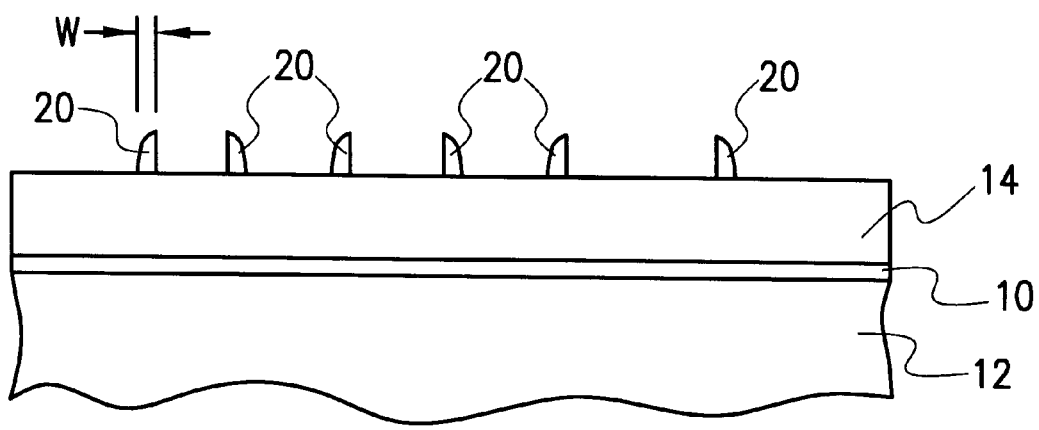

Turning now to FIG. 3, the photoresist pattern 16 is then removed. Removal of pattern 16 is accomplished using any suitable highly selective etch. The use of a highly selective etch keeps undercut to a minimum. A slight undercut 21, however, is not detrimental so long as the sacrificial spacers 20 remain in tact, thus ensuring a desired formation of the small length feature in the underlying polysilicon 14. Upon removal of the photoresist pattern 16, only the patterned sacrificial spacers 20 remain above the polysilicon layer.

Figure 4:
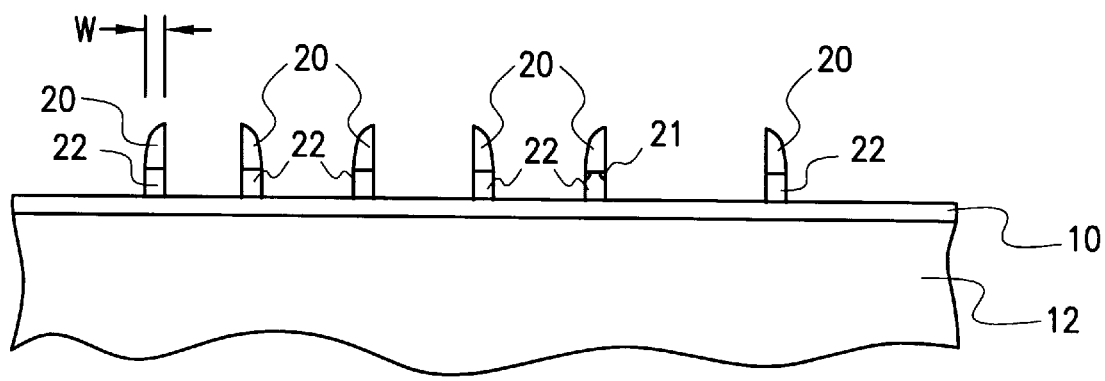

Turning now to FIG. 4, an appropriate directional etch is used for etching into the polysilicon layer 14, wherein the sacrificial sidewall spacers 20 are used as a masking pattern layer for etching into the polysilicon 14. The resultant features 22 include, for example, patterned polysilicon gate electrodes in the polysilicon layer 14 having small dimensions on the order of the sacrificial spacer dimension. During etching of the polysilicon with a directional etch, the oxide spacers prevent etching of the corresponding underlying polysilicon. The resulting polysilicon features thus have a feature length much smaller than that achievable alone using the standard photolithographic techniques known in the art. Stated alternatively, the resultant etched features thus have a size that are smaller than that achievable by the photolithographic technique alone.

Figure 5:
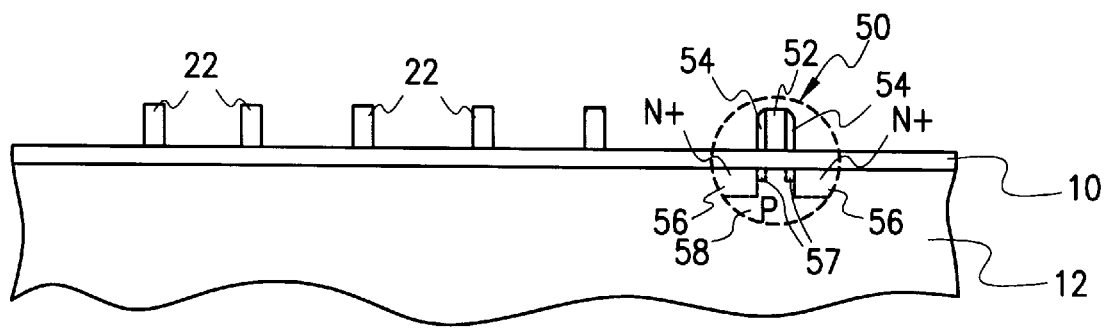

Referring now to FIG. 5, the sidewall spacers 20 have been removed using an appropriate etch. In some instances, it may be desirable to leave the sidewall spacers 20 intact and not to remove the same.

As shown in FIG. 5, a high performance metal-oxide-semiconductor field-effect-transistor (MOSFET) 50 can be produced using the method as described herein above in accordance with the present invention. Specifically, the gate electrode 52 is fabricated in accordance with the present invention and includes a line width dimension "w" smaller than that which is achievable using a standard lithographic process alone. Formation of the sidewall spacers 54, the highly doped source and drain regions 56, and the lightly doped drain (LDD) regions 57 can be accomplished using standard techniques known in the art for formation of the same. In addition, source and drain regions 56 can include $N^+$ regions, for example. The LDD regions 57 can include N regions in a P-type silicon substrate 58. Alternatively, the conductivity types may be the opposite as stated, i.e., regions 56, 57, and 58 may include $P^+$, P, and N-type regions, respectively. Still further, the present invention can be implemented in an integrated circuit. The present invention advantageously enables the achievement of a small line width gate in a MOSFET to be economically and easily produced without resort to cost prohibitive lithographic techniques. Such a small line width gate electrode increases the performance characteristics of a MOSFET device and, thus, the performance of the integrated circuit to which it is a part of.

While the invention has been discussed with respect to the patterning of a polysilicon layer in the formation of polysilicon gate electrodes, alternatively, the present invention is equally applicable to the formation of metal lines having line widths smaller than that alone of the photolithographic technique used. In the later instance, a layer of metal (instead of polysilicon 14 of FIG. 1) is patterned using the above described technique in accordance with the present invention. That is, the photoresist 16 is deposited and patterned upon a top surface of a blanket layer of metal. The pattern of the photoresist is appropriately designed such that the oxide spacers 20 may be made adjacent to the features of the pattern layer and such that the oxide spacers are placed in accordance with the desired pattern of the resultant small line width metal features, similarly as discussed herein above with respect to the formation of the small line width polysilicon features. In addition to photoresist and oxide, alternate materials may include metal and oxide, or any other compatible combination. Metal lines produced in accordance with the alternate embodiment of the present invention may be well suited for use as signal lines in signal layers of an integrated circuit or in a multilayer module. Again, the present invention advantageously enables the creation of small line width features without resorting to more costly high resolution lithographic techniques.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A structure having small line width features lithographically fabricated in accordance with a desired pattern and having small line width feature sizes smaller than that capable of a lithographic process alone, said structure fabricated by a method comprising the steps of:

providing a first layer of material upon a substrate, the first layer including that in which the small line width features are to be made;

providing a lithographically patterned layer upon the first layer in accordance with a second pattern defined in conjunction with the desired pattern, the patterned layer including a second material selected to be compatible with the material of the first layer;

depositing a conformal layer upon the patterned layer, the conformal layer including a third material selected to be compatible in conjunction with the first material and with the second material;

forming sidewall spacers in the conformal layer proximate side edges of the patterned layer, the sidewall spacers having a desired line width dimension of the small features to be fabricated;

selectively removing the patterned layer; and directionally etching the first layer with a selective etch and using the sidewall spacers to prevent the etching of the first layer in accordance with the desired pattern such that two separate gate electrodes are formed, one from each sidewall spacer, and such that the spacing between each of the so formed gate electrodes is less than 0.1 μm and wherein the remaining material forms gate electrodes each having dimension of less than 0.1 μm.

2. The structure of claim 1 includes a high performance metal-oxide-semiconductor field-effect-transistor (MOSFET) having a small line width feature size gate electrode, wherein the lithographic process is i-line lithography and the desired line width dimension of the gate electrode is in the range of 0.05 to 0.1 μm.

3. The structure of claim 1 includes a signal line layer having small line width feature size metal signal lines, wherein the lithographic process is i-line lithography and the desired line width dimension of the signal lines is in the range of 0.05 to 0.1 μm.

4. A high performance metal-oxide-semiconductor field-effect transistor (MOSFET) device including a lithographically fabricated small gate electrode, the small gate electrode having a line width dimension less than that achievable by a lithographic process alone, said MOSFET being produced by the method comprising the steps of:

providing a polysilicon layer upon a gate oxide layer;

providing a lithographically patterned photo resist layer upon said polysilicon layer, the patterned layer including sidewalls;

depositing a conformal layer of oxide upon the patterned layer;

forming sidewall spacers in the blanket oxide layer proximate the sidewalls in the patterned layer, the sidewall spacers having a desired width dimension;

removing the patterned layer;

etching the polysilicon layer using the sidewall spacers as a secondary pattern such that two separate gate electrodes are formed, one from each sidewall spacer and such that the spacing between each of the so formed gate electrodes is less than 0.1 μm, wherein the remaining polysilicon includes two small gate electrodes and wherein the small gate electrodes will have a dimension of less than 0.1 μm.

5. The MOSFET device of claim 4, wherein the lithographic process is i-line lithography and the desired line width feature size is in the range of 0.05 to 0.1 μm.

6. An integrated circuit having small line width features lithographically fabricated in accordance with a desired pattern and further having small line width feature sizes smaller than that capable of a lithographic process alone, said integrated circuit having been fabricated according to a method comprising the steps of:

providing a first layer of material upon a substrate, the first layer including that in which the small line width features are to be made;

providing a lithographically patterned layer upon the first layer in accordance with a second pattern defined in conjunction with the desired pattern, the patterned layer including a second material selected to be compatible with the material of the first layer;

depositing a conformal layer upon the patterned layer, the conformal layer including a third material selected to be compatible in conjunction with the first material and with the second material;

forming sidewall spacers in the conformal layer proximate side edges of the patterned layer, the sidewall spacers having a desired line width dimension of the small features to be fabricated;

selectively removing the patterned layer; and directionally etching the first layer with a selective etch and using the sidewall spacers to prevent the etching of the first layer in accordance with the desired pattern such that the spacing between each of the so formed gate electrodes is less than 0.1 μm and wherein the remaining material forms gate electrodes each having a lateral dimension of less than 0.1 μm.

7. A module having conductive signal lines including small line width features lithographically fabricated in accordance with a desired pattern and having small line width feature sizes smaller than that capable of a lithographic process alone, said module having been fabricated according to a method comprising the steps of:

providing a first layer of material upon a substrate, the first layer including that in which the small line width features arc to be made;

providing a lithographically patterned layer upon the first layer in accordance with a second pattern defined in conjunction with the desired pattern, the patterned layer including a second material selected to be compatible with the material of the first layer;

depositing a conformal layer upon the patterned layer, the conformal layer including a third material selected to be compatible in conjunction with the first material and with the second material; forming sidewall spacers in the conformal layer proximate side edges of the patterned layer, the sidewall spacers having a desired line width dimension of the small features to be fabricated;

selectively removing the patterned layer; and directionally etching the first layer with a selective etch and using the sidewall spacers to prevent the etching of the first layer in accordance with the desired pattern such that the spacing between each of the so formed gate electrodes is less than 0.1 μm and wherein the remaining material forms gate electrodes each having a lateral dimension of less than 0.1 μm.

* * * * *